United States Patent
Cheng et al.

(10) Patent No.: US 10,347,488 B2
(45) Date of Patent: Jul. 9, 2019

(54) TITANIUM COMPOUND BASED HARD MASK FILMS

(71) Applicant: Applied Materials, Inc., Santa Clara, CA (US)

(72) Inventors: Rui Cheng, Santa Clara, CA (US); Wei Tang, Santa Clara, CA (US); Pramit Manna, Sunnyvale, CA (US); Abhijit Basu Mallick, Palo Alto, CA (US); Srinivas Gandikota, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/268,797

(22) Filed: Sep. 19, 2016

(65) Prior Publication Data

US 2017/0084459 A1    Mar. 23, 2017

Related U.S. Application Data

(60) Provisional application No. 62/220,962, filed on Sep. 19, 2015.

(51) Int. Cl.
*H01L 21/02*    (2006.01)
*H01L 21/033*    (2006.01)

(52) U.S. Cl.
CPC .... *H01L 21/0332* (2013.01); *H01L 21/02153* (2013.01); *H01L 21/02186* (2013.01); *H01L 21/02227* (2013.01); *H01L 21/02271* (2013.01); *H01L 21/02274* (2013.01)

(58) Field of Classification Search
CPC ..... C23C 16/042; C23C 16/047; C23C 16/06; C23C 16/45512
See application file for complete search history.

(56) References Cited

U.S. PATENT DOCUMENTS

| | | | |
|---|---|---|---|
| 8,796,150 B2 | 8/2014 | Akinmade-Yusuff et al. | |
| 9,064,813 B2 | 6/2015 | Kanakasabapathy et al. | |
| 9,171,720 B2 | 10/2015 | Wang et al. | |
| 9,219,007 B2 | 12/2015 | Chen et al. | |
| 9,355,862 B2 | 5/2016 | Pandit et al. | |
| 2001/0016426 A1 | 8/2001 | Lee et al. | |
| 2003/0008490 A1 | 1/2003 | Xing et al. | |
| 2006/0003544 A1 | 1/2006 | Derderian et al. | |
| 2007/0116888 A1* | 5/2007 | Faguet | C23C 16/45525 427/569 |
| 2009/0017616 A1 | 1/2009 | Grunow et al. | |
| 2013/0174982 A1* | 7/2013 | Lin | H01L 21/0332 156/345.3 |
| 2013/0203266 A1* | 8/2013 | Hintze | H01L 21/32051 438/763 |
| 2013/0216776 A1* | 8/2013 | Arnold | G03F 7/0035 428/141 |
| 2013/0320564 A1 | 12/2013 | Brain et al. | |
| 2014/0057099 A1 | 2/2014 | Koshy | |
| 2014/0199628 A1* | 7/2014 | Edelstein | G03F 7/094 430/270.1 |
| 2015/0087154 A1 | 3/2015 | Guha et al. | |
| 2015/0118394 A1 | 4/2015 | Varadarajan et al. | |
| 2015/0187579 A1 | 7/2015 | Lin et al. | |
| 2015/0228496 A1 | 8/2015 | Nakano | |
| 2016/0027645 A1 | 1/2016 | Shin et al. | |

FOREIGN PATENT DOCUMENTS

JP    2015151575 A    8/2015
WO    2015026342 A1    2/2015

OTHER PUBLICATIONS

PCT International Search Report and Written Opinion in PCT/US2016/052425 dated Jan. 3, 2017, 10 pages.
PCT International Preliminary Report on Patentability in PCT/US2016/052425 dated Mar. 29, 2018, 7 pages.

* cited by examiner

*Primary Examiner* — Kelly M Gambetta
(74) *Attorney, Agent, or Firm* — Servilla Whitney LLC

(57) ABSTRACT

Methods for forming a titanium-containing hard mask film on a substrate surface by exposing the substrate surface to a titanium-containing precursor. The titanium-containing hard mask comprises one or more of silicon, oxygen or carbon atoms and, optionally, nitrogen atoms.

19 Claims, No Drawings

TITANIUM COMPOUND BASED HARD MASK FILMS

CROSS-REFERENCE TO RELATED APPLICATIONS

This application claims priority to U.S. Provisional Application No. 62/220,962, filed Sep. 19, 2015, the entire disclosure of which is hereby incorporated by reference herein.

FIELD

Embodiments of the disclosure generally relate to methods of forming hard mask films. More particularly, embodiments of the disclosure relate to methods of forming hard mask films comprising titanium.

BACKGROUND

Hard mask films are used for etching deep, high aspect ratio (HAR) features that conventional photoresists cannot withstand. Amorphous Carbon is currently used as a hard mask layer to provide high etch selectivity to organic materials such as photoresist, dielectric materials such as $SiO_2$, SiN, and low-k dielectric materials. Due to the increasing thickness of under layer films, the thickness of hard mask continues to increase.

Moreover, amorphous carbon films are usually non-transparent materials having high extinction coefficients. This poses a significant problem for the purpose of overlay alignment during lithography processes.

Therefore, there is a need in the art for new hard mask materials with better conformality and etch selectivity over conventional materials.

SUMMARY

One or more embodiments of the disclosure are directed to processing methods comprising exposing a substrate surface to a titanium-containing precursor in a processing chamber to form a titanium-containing hard mask comprising titanium atoms and one or more of silicon, oxygen or carbon atoms.

Additional embodiments of the disclosure are directed to processing methods comprising positioning a substrate having a surface in a processing chamber. The surface of the substrate is exposed to a titanium-containing precursor to form a titanium-containing hard mask. The titanium-containing precursor comprises one or more of tetrakis(dimethylamido)titanium and/or titanium isopropoxide. The titanium-containing hard mask comprising titanium atoms and one or more of silicon, oxygen or carbon atoms.

Further embodiments of the disclosure are directed to processing methods comprising positioning a substrate having a surface in a processing chamber. The surface has at least one feature thereon. The surface of the substrate is exposed to a titanium-containing precursor and an optional co-reactant to form a titanium-containing hard mask conformally on the at least one feature. The titanium-containing precursor comprises one or more of tetrakis(dimethylamido) titanium and/or titanium isopropoxide. The co-reactant comprises one or more species including one or more of silicon, oxygen, nitrogen and carbon atoms, and, optionally, nitrogen atoms.

DETAILED DESCRIPTION

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise.

Reference throughout this specification to "one embodiment," "certain embodiments," "various embodiments," "one or more embodiments" or "an embodiment" means that a particular feature, structure, material, or characteristic described in connection with the embodiment may be included in at least one embodiment of the disclosure. Furthermore, the appearances of the phrases such as "in one or more embodiments," "in certain embodiments," "in one embodiment" or "in an embodiment" in various places throughout this specification are not necessarily referring to the same embodiment of the disclosure. In addition, the particular features, structures, materials, or characteristics described may be combined in any suitable manner in one or more embodiments.

As used in this specification and the appended claims, the terms "substrate" and "wafer" are used interchangeably, both referring to a thin piece of material having a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate surface" as used herein, refers to an exposed face of any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, silicon carbide, doped silicon, germanium, gallium arsenide, glass, sapphire, and any other materials such as metals, metal nitrides, metal carbides, metal alloys, and other conductive materials, depending on the application. Substrates include, without limitation, semiconductor and insulating wafers, which may or may not have been further processed to produce electronic and/or optoelectronic devices. Substrates may be exposed to a pretreatment process to clean, polish, etch, reduce, oxidize, hydroxylate, anneal and/or bake the substrate surface. In addition to film processing directly on the surface of the substrate itself, in the embodiments of the present disclosure any of the film processing steps disclosed may also be performed on an underlayer formed on the substrate as disclosed in more detail below, and the term "substrate surface" is predetermined to include such underlayer(s) as the context indicates, for example vias passing through thin semiconducting and/or insulating layers on an SOI wafer.

Substrates for use with the embodiments of the disclosure can be any suitable substrate. In some embodiments, the substrate is a rigid, discrete, generally planar substrate. As used in this specification and the appended claims, the term "discrete" when referring to a substrate means that the substrate has a fixed dimension. The substrate of one or more embodiments is a semiconductor substrate, such as a 200 mm or 300 mm diameter silicon substrate. In some embodiments, the substrate is one or more of silicon, silicon germanium, gallium arsenide, gallium nitride, germanium, gallium phosphide, indium phosphide, sapphire and silicon carbide.

Embodiments of the disclosure are directed to titanium-containing films (such as TiO, TiON, TiSiN, TiCN, TiCO, TiC, etc.) deposited by chemical vapor deposition (CVD) methods as hard mask films. Titanium-containing films, according to some embodiments, can be deposited in a CVD chamber using a titanium precursor (such as tetrakis(dimethylamido)titanium), titanium isopropoxide, etc.), Silicon precursor (such as $SiH_4$, $Si_2H_6$, etc.), $O_2$, $H_2O$, $N_2O$, $C_2H_2$, $C_3H_6$, and $NH_3$. A plasma enhanced chemical vapor deposition process (PECVD) may be used to reduce deposition temperature.

Titanium films are known to have high films stresses which can be an issue for use in hard mask film. Titanium nitride films have a columnar structure which may cause post-processing issues because the edge of the film is not smooth resulting in a non-uniform etch profile selectivity at the boundary of the films. Embodiments of the disclosure provide films with reduced stress and columnar structures.

Conventional titanium nitride films have grain boundaries because the film is polycrystalline. Embodiments of the disclosure provide methods of depositing titanium hard mask films that are substantially amorphous. As used in this regard, the term "substantially amorphous" means that the surface area of the film is greater than or equal to about 90% amorphous. In some embodiments, the surface area of the film is greater than or equal to about 95%, 96%, 97%, 98% or 99% amorphous.

Embodiments of the disclosure provide titanium-containing films for use as hard masks for reactive ion etching (RIE) processes. The films of some embodiments may comprise Ti, Si, O, N and/or C. Films can be deposited in conventional CVD chambers with titanium precursors and/or silicon precursors and/or $O_2$, $H_2O$, $N_2O$, $C_2H_2$, $C_3H_6$, and $NH_3$.

Embodiments of the disclosure are directed to processes to deposit titanium-containing hard mask films. Some embodiments of the disclosure provide films that are formed at relatively low temperatures, allowing preservation of the thermal budget during device formation. Some embodiments of the disclosure provide films with conformality greater than or equal to about 98%. Some embodiments of the disclosure provide methods of forming titanium-containing hard mask films with good RIE selectivity.

Some embodiments of the disclosure are directed to processing methods in which a substrate surface is exposed to a titanium-containing precursor to form a titanium-containing hard mask. In some embodiments, the titanium-containing hard mask comprises at least about 25 atomic % titanium. In some embodiments, the titanium-containing hard mask comprises at least about 30, 35, 40, 45, 50, 55, 60, 65, 70 or 75 atomic percent titanium.

The titanium-containing hard mask of some embodiments comprises one or more of silicon, oxygen, nitrogen and/or carbon atoms. In one or more embodiments, the titanium-containing hard mask comprises titanium atoms and one or more of silicon, oxygen and/or carbon atoms. In some embodiments, the hard mask comprises silicon atoms. In some embodiments, the hard mask comprises oxygen atoms. In some embodiments, the hard mask comprises nitrogen atoms. In some embodiments, the hard mask comprises carbon atoms. In one or more embodiments, the atomic percent of any of the silicon, carbon, nitrogen or oxygen atoms in the hard mask is greater than or equal to about 20, 25, 30, 35, 40, 45 or 50 atomic percent.

In some embodiments, the titanium-containing hard mask comprises titanium atoms and one or more of silicon, oxygen and/or carbon atoms, and, optionally, nitrogen atoms. For example, in some embodiments, the hard mask is one or more of TiSi, TiO, TiC, TiSiC, TiSiO, TiSiCO and/or TiOC. The hard mask can also include nitrogen atoms so that the hard mask is one or more of TiSiN, TiON, TiCN, TiSiCN, TiSiON, TiSiCON and/or TiOCN.

In some embodiments, the substrate surface comprises a carbon-containing film and forming the titanium-containing hard mask comprises doping the carbon-containing film with titanium atoms. In a titanium-doped carbon hard mask of some embodiments, the titanium composition is greater than or equal to about 2, 5, 10 or 15 atomic percent. In a titanium-doped hard mask of some embodiments, the titanium composition is less than or equal to about 50, 45, 40, 35, 30 or 25 atomic percent.

The titanium-containing precursor can comprise any suitable titanium-containing compounds that can decompose at a temperature less than about 650° C., or 600° C., or 550° C. In some embodiments, the titanium-containing precursor comprises one or more of tetrakis(dimethylamido)titanium and/or titanium isopropoxide, and/or titanium diisopropoxide bis(acetylacetonate), and/or titanium bis(isopropoxide) bis(tert-Butylacetoacetate.

In some embodiments, the temperature at which the titanium-containing hard mask is formed in the range of about 200° C. to about 650° C. In one or more embodiments, the temperature at which the titanium-containing hard mask forms is less than or equal to about 550° C., or less than or equal to about 520° C., or less than or equal to about 480° C., or less than or equal to about 400° C., or less than or equal to about 380° C.

In use, a substrate is positioned within a processing chamber and the titanium-containing precursor is flowed into the processing chamber to react with the substrate surface. In some embodiments, the titanium-containing precursor is flowed into the processing chamber with or without a carrier gas. As used in this regard, a carrier gas is a gas that does not react with either the titanium-containing precursor or the substrate surface.

In some embodiments, the titanium-containing precursor is flowed into the processing chamber with a co-reactant. The co-reactant comprises one or more reactive species including one or more of silicon, oxygen, nitrogen and/or carbon. In some embodiments, the co-reactant increases the atomic percentage of one or more of silicon, oxygen, nitrogen and/or carbon in the titanium-containing hard mask. The co-reactant can be mixed with the titanium-containing precursor before flowing into the processing chamber or mixed with the titanium-containing precursor within the processing chamber in a reaction space adjacent the substrate surface.

In some embodiments, the titanium-containing precursor is exposed to a plasma in processing chamber to form the titanium-containing hard mask. The plasma can be a direct plasma which is ignited within the processing chamber immediately adjacent the substrate surface or can be a remote plasma which is ignited outside of the processing chamber and flowed into the processing region adjacent the substrate surface. In some embodiments, the plasma comprises one or more of hydrogen, $C_3H_6$, $C_2H_2$, $CH_4$, $NH_3$, nitrogen, helium or argon.

In some embodiments, the substrate surface comprises at least one feature thereon. A "feature" as used in this specification and the appended claims, refers to any non-flat portions of a substrate. For example, a feature can be a trench or a peak. Features generally include at least one "vertical" surface and either a top or bottom "horizontal" surface. A vertical surface is one that extends at an angle to the substrate surface in the range of about 70° to about 110°, with a surface normal measured at 90°. A horizontal surface is one that extends at an angle to the normal of the substrate in the range of about 0° to about 20°.

In one or more embodiments, the titanium-containing hard mask forms conformally on at least one feature. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer in various embodiments of the disclosure would provide coverage over the deposited region of essentially uniform thickness on complex surfaces.

As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

The titanium-containing hard mask of some embodiments is substantially transparent to light at a predetermined wavelength. As used in this specification and the appended claims, the term "substantially transparent" means that the film absorbs less than about 10% or 5% of light at the predetermined wavelength. The predetermined wavelength can be any suitable wavelength of light that is used to interact with any film formed beneath the titanium-containing hard mask.

In some embodiments, the titanium-containing hard mask is resistant to etching. As used in this specification and the appended claims, the term "resistant to etching" means that the film has a 300% improvement comparing to standard carbon hard mask during an SiO or a-Si dry etch process by RIE.

In one or more embodiments, the titanium-containing hard mask formed is substantially amorphous. As used in this specification and the appended claims, the term "substantially amorphous" means that the film is less than or equal to about 10% or 5% crystalline.

In some embodiments, the method further comprises irradiating the substrate surface through the titanium-containing hard mask using light of a wavelength to which the titanium-containing hard mask is substantially transparent. In one or more embodiments, the method further comprises removing the hardmask after irradiating the substrate surface beneath the titanium-containing hard mask.

EXAMPLES

A smooth, uniform titanium-containing film was deposited on a silicon substrate at a temperature of about 365° C. The film had a thickness of about 3000 Å. Reactive-ion etching (RIE) was performed in $Cl_2/NF_3/O_2$. Results showed that the etch selectivity of titanium-containing hard mask was three times better than a conventional mask material on the market.

While the foregoing is directed to embodiments of the present invention, other and further embodiments of the disclosure may be devised without departing from the basic scope thereof, and the scope thereof is determined by the claims that follow.

What is claimed is:

1. A processing method comprising flowing a titanium-containing precursor into a processing chamber with a co-reactant comprising one or more species including one or more of silicon, oxygen, and/or carbon atoms to react with a substrate surface and form a titanium-containing hard mask comprising titanium atoms and one or more of silicon, oxygen or carbon atoms, wherein the substrate surface comprises a carbon containing film.

2. The processing method of claim 1, wherein the titanium-containing precursor comprises one or more of tetrakis(dimethylamido)titanium, titanium isopropoxide, titanium diisopropoxide bis(acetylacetonate), and/or titanium bis(isopropoxide) bis(tert-butylacetoacetate).

3. The processing method of claim 1, wherein the titanium-containing hard mask further comprises nitrogen atoms.

4. The processing method of claim 3, wherein the silicon, oxygen, nitrogen and/or carbon atoms are present in an amount greater than or equal to about 5 atomic percent.

5. The processing method of claim 1, wherein forming the titanium-containing hard mask comprises titanium doping of the carbon-containing film.

6. The processing method of claim 3, wherein the titanium-containing hard mask is substantially amorphous.

7. The processing method of claim 3, wherein the co-reactant comprises one or more species including nitrogen atoms.

8. The processing method of claim 1, wherein the co-reactant comprises one or more of $SiH_4$, $Si_2H_6$, $O_2$, $H_2O$, $N_2O$, $C_2H_2$, and $C_3H_6$.

9. The processing method of claim 1, wherein the co-reactant is mixed with the titanium-containing precursor before flowing into the processing chamber.

10. The processing method of claim 1, wherein the co-reactant is mixed with the titanium-containing precursor in a reaction space adjacent the substrate surface within the processing chamber.

11. The processing method of claim 1, wherein the titanium-containing precursor is exposed to a plasma in the processing chamber to form the titanium-containing hard mask.

12. The processing method of claim 11, wherein the plasma comprises one or more of hydrogen, nitrogen, helium or argon.

13. The processing method of claim 1, wherein the substrate surface comprises at least one feature thereon.

14. The processing method of claim 13, wherein the titanium-containing hard mask forms conformally on the at least one feature.

15. The processing method of claim 1, wherein the titanium-containing hard mask is substantially transparent to light at a predetermined wavelength.

16. The processing method of claim 15, further comprising:
    irradiating the substrate surface through the titanium-containing hard mask using light of the predetermined wavelength; and
    removing the titanium-containing hard mask after irradiating the substrate surface.

17. A processing method comprising:
    positioning a substrate having a surface in a processing chamber; and
    exposing the surface of the substrate to a titanium-containing precursor and a co-reactant to form a titanium-containing hard mask, the titanium-containing precursor comprising one or more of tetrakis(dimethylamido)titanium, titanium isopropoxide, titanium diisopropoxide bis(acetylacetonate), and/or titanium bis(isopropoxide) bis(tert-butylacetoacetate), the co-reactant comprising one or more species including one or more of silicon, oxygen, or carbon atoms, the titanium-containing hard mask comprising titanium atoms and one or more of silicon, oxygen or carbon atoms, wherein the substrate surface comprises a carbon containing film.

18. The processing method of claim 17, wherein the co-reactant comprises one or more species including nitrogen atoms.

19. A processing method comprising:

positioning a substrate having a surface in a processing chamber, the surface having at least one feature thereon; and exposing the surface of the substrate to a titanium-containing precursor and an optional co-reactant to form a titanium-containing hard mask conformally on the at least one feature, the titanium-containing precursor comprising one or more of tetrakis(dimethylamido) titanium and/or titanium isopropoxide, the co-reactant comprising one or more species including one or more of silicon, oxygen, nitrogen and carbon atoms and the titanium-containing hard mask comprising titanium atoms and one or more of oxygen, silicon or carbon atoms, and, optionally, nitrogen atoms wherein the substrate surface comprises a carbon containing film.

* * * * *